United States Patent [19]

Dotson et al.

[11] Patent Number: 4,461,989
[45] Date of Patent: Jul. 24, 1984

[54] VOLTAGE SENSE CIRCUIT FOR A BUBBLE MEMORY VOLTAGE BOOSTER

[75] Inventors: Robert N. Dotson, Mesa; Robert B. Davies; Ira Miller, both of Tempe, all of Ariz.

[73] Assignee: Motorola, Inc., Schaumburg, Ill.

[21] Appl. No.: 412,069

[22] Filed: Aug. 27, 1982

[51] Int. Cl.³ .......................... G05F 1/10; G05F 3/20
[52] U.S. Cl. .................................... 323/222; 323/316; 323/317; 330/257
[58] Field of Search ...................... 323/222, 282–285, 323/315–317; 330/257, 261, 288

[56] References Cited

U.S. PATENT DOCUMENTS

| | | | |
|---|---|---|---|
| 3,721,893 | 3/1973 | Davis | 323/317 |
| 4,355,277 | 10/1982 | Davis et al. | 323/222 X |
| 4,392,103 | 7/1983 | O'Sullivan et al. | 323/285 X |
| 4,399,399 | 8/1983 | Joseph | 323/316 X |

*Primary Examiner*—Peter S. Wong
*Attorney, Agent, or Firm*—Vincent B. Ingrassia

[57] ABSTRACT

In a voltage boost circuit for use in conjunction with a bubble memory operational driver, an output transistor alternately turns on and off so as to permit current to flow through an inductor which, when terminated by turning off the output transistor, causes a high voltage to be built up across the inductor which causes charge to be transferred to and stored in a capacitor. The output transistor is not turned on again until the voltage across the inductor falls below a predetermined value. A current mirror circuit is coupled to the comparator input and includes a buffer transistor which, when the voltage at the comparator input exceeds the breakdown voltage of the buffer transistor, acts as a $BV_{ceo}$ level shifter.

13 Claims, 1 Drawing Figure

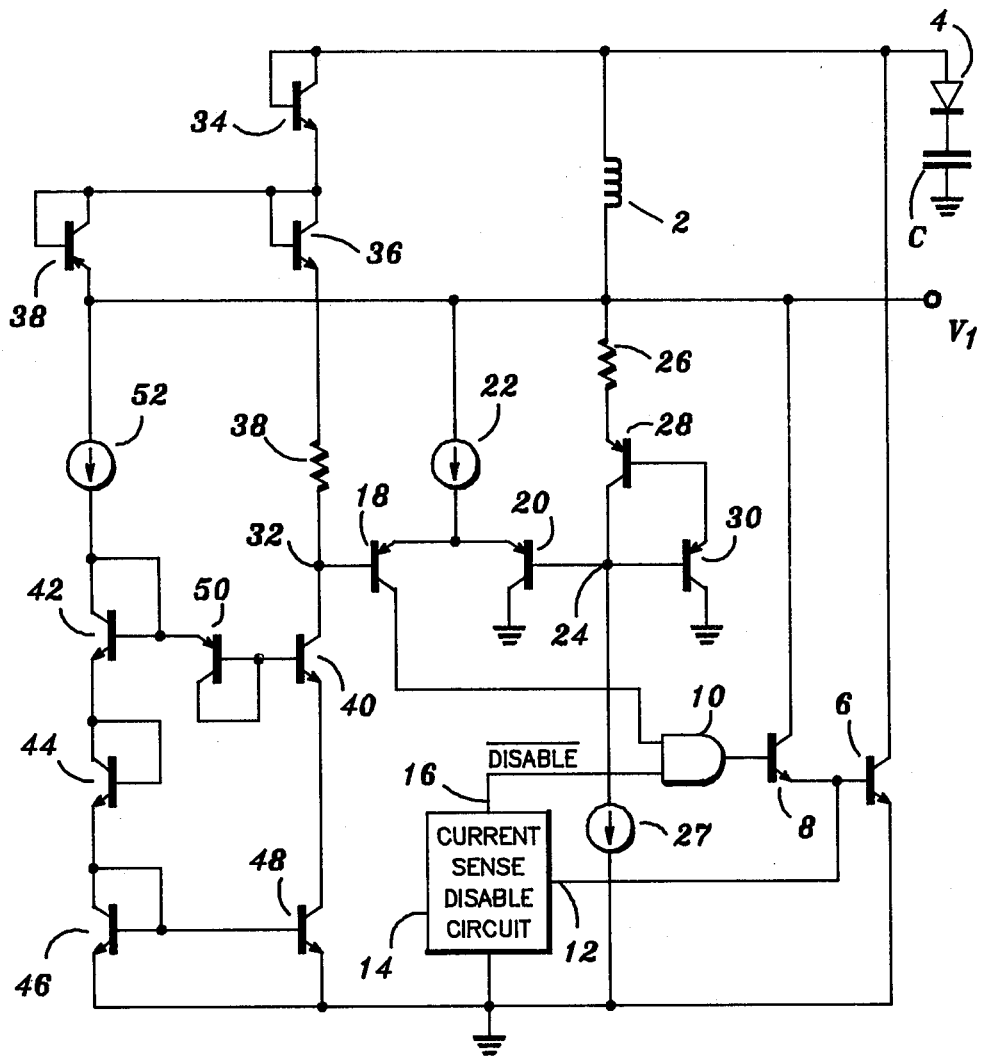

VOLTAGE SENSE CIRCUIT FOR A BUBBLE MEMORY VOLTAGE BOOSTER

BACKGROUND OF THE INVENTION

This invention relates generally to voltage boost circuits and, more particularly, to a monolithically integrable circuit for sensing a high voltage, which circuit is manufactured using a low voltage process.

The voltage booster of a bubble memory operational driver requires circuitry for sensing when the voltage on an inductor decreases to a value approximately equal to the supply voltage (e.g. 5 volts). This is necessary to determine the earliest time at which a pull-down output transistor may be turned on which in turn permits current to flow through the inductor. At some time thereafter, current flow through the pull-down transistor is terminated (i.e. the pull-down transistor is turned off). As a result, a voltage is induced across the inductor which results in charge being stored in the capacitor. When the voltage on the inductor decreases as described earlier, the pull-down transistor is turned on, and the process is repeated until a predetermined high voltage is built up across the capacitor.

In a prior art approach, the voltage on the inductor is sensed by a resistor coupled to the emitter of a first transistor, the base of which is coupled to a source of supply voltage (typically five volts). The collector of this transistor supplies base drive to a second transistor having an emitter coupled to ground which, when turned on, diverts base current away from the pull-down transistor turning it off and terminating current flow through the pull down transistor. Thus, when the terminal of the resistor connected to the inductor exceeds the supply voltage by a predetermined amount, the first and second transistors are turned on maintaining the pull-down transistor in an off condition.

Unfortunately, this prior art approach has certain disadvantages. First, the regulated boost voltage which, as indicated earlier, may be as high as 50 volts results in excessive current loss in the resistor (e.g. approximately 8.3 milliamperes if the resistor is 6 K-ohms). If the resistor were increased to approximately 250 K-ohms, the current loss would be reduced to approximately 200 microamperes; however, at a resistivity of 5 K-ohms per square, an excessive amount of die space would be required (i.e. a 50 square resistor). The problem is further complicated when a low voltage semiconductor manufacturing process is employed; i.e. $BV_{ceo}$ equals approximately 18 volts.

SUMMARY OF THE INVENTION

It is an object of the present invention to provide an improved high voltage sense circuit.

It is a further object of the present invention to provide an improved monolithically integrable high voltage sense circuit for use in conjunction with a bubble memory boost circuit.

It is a still further object of the present invention to provide a monolithically integrable high voltage sense circuit capable of being manufactured using a low voltage semiconductor process;

Yet another object of the present invention is to provide a monolithically integrable high voltage sense circuit for use in conjunction with a bubble memory voltage boost circuit, which sense circuit substantially reduces current loss.

It is a still further object of the present invention to provide a monolithically integrable high voltage sense circuit for use in conjunction with a bubble memory boost circuit, which sense circuit occupies less chip area.

According to a broad aspect of the invention there is provided an apparatus for sensing when the voltage at a node falls to a predetermined value, comprising: comparator means having a first input coupled to said node and having a second input; a first supply voltage conductor; reference voltage generating means coupled to the second input of said comparator means and to said first supply voltage conductor for establishing a reference voltage at said second input; a second supply voltage conductor; current mirror means coupled to said node and to said first and second supply voltage conductors for receiving a first current and for generating a second current; and transistor means including at least one transistor coupled between said node and said current mirror means for acting as a $BV_{ceo}$ level shifter when the voltage at said node exceeds the breakdown voltage of said at least one transistor where $BV_{ceo}$ is the collector-emitter breakdown voltage with an open base.

According to a further aspect of the invention there is provided a voltage boost circuit for generating a high voltage across a capacitor by alternately drawing current through an inductor coupled to said capacitor and terminating said current so as to produce a voltage across said inductor which causes charge to be transferred to and stored in said capacitor, comprising: first and second supply voltage conductors; comparator means having a first input coupled to a first terminal of said inductor and having a second input; reference voltage generating means coupled to the second input of said comparator means and to said first and second supply voltage conductors for establishing a reference voltage at said second input; current mirror means coupled to said first input for receiving a first current and for generating a second current; transistor means including at least one transistor coupled between said first input and said current mirror means for acting as a $BV_{ceo}$ level shifter when the voltage at said first input exceeds the breakdown voltage of said at least one transistor; output transistor means having a collector coupled to said first terminal, an emitter coupled to said second supply voltage conductor and having a base; and first means coupled between said comparator means and the base of said output transistor means for turning said output transistor means on so as to cause current to flow through said inductor when the voltage at said second terminal is below a predetermined value and for turning said output transistor means off when the current flowing through said output transistor means reaches a predetermined value.

BRIEF DESCRIPTION OF THE DRAWINGS

The above and other objects, features and advantages of the present invention will be more clearly understood from the following detailed description taken in conjunction with the accompanying drawing which is a schematic diagram of the inventive high voltage sense circuit.

DESCRIPTION OF THE PREFERRED EMBODIMENT

Referring to the drawing, an inductor 2 has a first terminal coupled to a $V_1$ supply voltage conductor (typically 5 volts) and a second terminal coupled to a first terminal of capacitor C via rectifier 4. The second terminal of capacitor C is coupled to a second lower potential (typically ground). An output NPN transistor 6 has a collector coupled to the second terminal of inductor 2 and an emitter coupled to ground.

Output transistor 6 has a base coupled to the emitter of NPN transistor 8 which in turn has a collector coupled to $V_1$. The base of drive transistor 8 is coupled to the output of a drive gate 10 shown in the form of a typical AND gate. The base of transistor 6 is also coupled to a first input 12 of a current sense disable circuit of, for example, the type shown and described in co-pending U.S. patent application Ser. No. 412,057 entitled CURRENT SENSE CIRCUIT FOR A BUBBLE MEMORY VOLTAGE BOOSTER filed of even date herewith and assigned to the assignee of the present invention, the teachings of which are hereby incorporated by reference. A first output 16 of current sense disable circuit 14 is coupled to a first input of drive gate 10.

The circuit shown includes a comparator which comprises first and second PNP transistors 18 and 20 respectively having their emitters coupled together. A current source 22 is coupled between $V_1$ and the emitters of transistors 18 and 20 for supplying current thereto. The collector of transistor 20 is coupled to ground, and the collector of transistor 18 is coupled to a second input of drive gate 10. The base of transistor 20 is coupled to a comparator input node 24 at which a reference voltage is generated by resistor 26 and PNP transistors 28 and 30. The base of transistor 18 is coupled to comparator input node 32.

Resistor 26 has a first terminal coupled to $V_1$ and a second terminal coupled to the emitter of transistor 28. Both the collector of transistor 28 and the base of transistor 30 are coupled to node 24. The base of transistor 28 is coupled to the emitter of transistor 30, and the collector of transistor 30 is coupled to ground. Resistor 26 and transistors 28 and 30 merely serve as a level shift between $V_1$ and node 24 for the purpose of establishing a reference voltage thereat. A current source 27 is coupled between node 24 and ground.

A second slightly larger level shift is provided by NPN transistors 34 and 36 and resistor 38. Transistor 34 is coupled as a diode with its base and collector terminals coupled to the second terminal of inductor 2 and with its emitter terminal coupled to the base and collector terminals of transistor 36 which is also coupled as a diode. Resistor 38 is coupled between the emitter of transistor 36 and input node 32. This slightly larger level shift allows voltage sensing to occur when the collector of output transistor 6 is slightly greater than $V_1$ (5 volts). Transistor 38 is coupled as a diode with base and collector terminals coupled to the base and collector terminals of transistor 36 and its emitter terminal coupled to $V_1$. In this manner, if the voltage at the second terminal of inductor 2 should ring below $V_1$ (5 volts), transistor 34 will supply current via transistor 36 and resistor 38 and prevent transistors 18 and 40 from going into saturation.

The remainder of the circuit is a current mirror type circuit and includes current source 52 connected between $V_1$ and three series diode coupled transistors 42, 44 and 46. The emitter of transistor 46 is coupled to ground and its base is coupled to the base of NPN transistor 48 also having an emitter coupled to ground. NPN transistor 40 has an emitter coupled to the collector of transistor 48, a collector coupled to comparator input node 32 and a base coupled to the collector and base of transistor 50. The emitter of PNP transistor 50 is coupled to the base-collector of diode connected transistor 42.

Assuming that drive transistor 8 and output transistor 6 have been turned off through the action of current sense disable circuit 14, the voltage at the second terminal of inductor 2 will begin to fall after capacitor C is charged. When the voltage at comparator input node 32 falls to a value somewhat less than $V_1$ and slightly less than the voltage appearing at node 24, transistor 18 turns on enabling the second input of drive gate 10. As long as the current sense disable circuit 14 is not acting to disable output transistor 6, the first input of drive gate 10 ($\overline{\text{DISABLE}}$) will also be enabled thus supplying base drive to transistor 8 which in turn drives output transistor 6 turning it on. With transistor 6 on, current flows through inductor 2. When the current in the collector of output transistor 6 reaches a predetermined value, transistor 6 is disabled by current sense disable circuit 14; i.e. $\overline{\text{DISABLE}}$ goes low which produces a disabling output from drive gate 10. As is well known to those skilled in the art, this attempt at termination of current flow through inductor 2 is resisted by the inductor causing a large voltage to build up across its terminals which causes charge to be transferred to and stored in capacitor C. When the voltage at the second terminal of inductor 2 becomes sufficiently high, the voltage at node 32 also rises causing transistor 18 to turn off and transistor 20 to turn on. Transistor 18 will not again be turned on until the voltage at the second terminal of inductor 2 falls as described earlier.

Portions of the circuit shown in the drawing are manufactured using a low voltage process; i.e. $BV_{ceo}$ is approximately 18 volts. When the voltage at node 32 is below $BV_{ceo}$, transistor 50 is forward biased and transistors 42, 44, 46, 40 and 50 cooperate to clamp the collector of transistor 48 at one $V_{BE}$. If, for example, current source 52 is generating 50 micro-amps, approximately 50 micro-amps will be flowing in the collector of transistor 48. As the voltage at the second terminal of inductor 2 increases, however, the voltage appearing at node 32 will rise above the breakdown voltage $BV_{ceo}$. Transistor 50 will become reverse biased and transistor 40 will breakdown acting as a $BV_{ceo}$ level shifter between node 32 and the collector of transistor 48. When the voltage at the collector of transistor 6 is 50 volts, the voltage appearing at the collector of transistor 48 will be approximately 32 volts or approximately 2 times $BV_{ceo}$. It has been found that in this case, if current source 52 is generating 50 micro-amps, then the current flowing in the collector of transistor 48 will be approximately four times its nominal value; i.e., the maximum current flowing through transistor 48 will be about 200 micro-amps. Thus, while the current has been increased four-fold, it is still at a controllable level and does not result in the extreme current losses described earlier in conjunction with the prior art circuit.

The above description is given by way of example only. Changes in form and details may be made by one skilled in the art without departing from the scope of the invention as defined by appended claims.

We claim:
1. An apparatus for sensing when the voltage at a node falls to a predetermined value, comprising:
   comparator means having a first input coupled to said node and having a second input;
   a first supply voltage conductor;

reference voltage generating means coupled to the second input of said comparator means and to said first supply voltage conductor for establishing a reference voltage at said second input;

a second supply voltage conductor;

current mirror means coupled to said node and to said first and second supply voltage conductors for receiving a first current and for generating a second current; and transistor means including at least one transistor coupled between said node and said current mirror means for acting as a $BV_{ceo}$ level shifter when the voltage at said node exceeds the breakdown voltage of said at least one transistor where $BV_{ceo}$ is the collector-emitter breakdown voltage with an open base.

2. An apparatus according to claim 1 wherein said current mirror means comprises:

a first transistor having an emitter coupled to said second supply voltage conductor and having a base and collector coupled to receive said first current;

a second transistor having an emitter coupled to said second supply voltage conductor, a base coupled to the base of said first transistor and a collector at which said second current is generated, said at least one transistor being coupled between said node and the collector of said second transistor such that when the voltage at said node exceeds the breakdown voltage of said at least one transistor, said second current substantially exceeds said first current and when the voltage at said node is below of said break-down voltage, said first and second currents are substantially equal.

3. An apparatus according to claim 2 further including a means for limiting the voltage across the collector and the emitter of said second transistor to $V_{BE}$ when the voltage at said node is less than said break-down voltage.

4. An apparatus according to claim 3 wherein said at least one transistor has a collector coupled to said node, an emitter coupled to the collector of said second transistor and a base, and wherein said means for limiting comprises first, second, and third diode connected transistors coupled between the collector of said first transistor and the base of said at least one transistor.

5. An apparatus according to claim 4 wherein said comparator means comprises:

a current source coupled to said first supply voltage conductor;

a fourth transistor having a base coupled to said node, an emitter coupled to said current source and having a collector; and a fifth transistor having an emitter coupled to said current source, a base coupled to said reference voltage generating means and a collector coupled to said second supply voltage conductor, said fourth transistor turning on when said node falls below said reference voltage so as to supply current to its collector.

6. A voltage boost circuit for generating a high voltage across a capacitor by alternately drawing current through an inductor coupled to said capacitor and terminating said current so as to produce a voltage across said inductor which causes charge to be transferred to and stored in said capacitor, comprising:

first and second supply voltage conductors;

comparator means having a first input coupled to a first terminal of said inductor and having a second input;

reference voltage generating means coupled to the second input of said comparator means and to said first and second supply voltage conductors for establishing a reference voltage at said second input;

current mirror means coupled to said first input for receiving a first current and for generating a second current;

transistor means including at least one transistor coupled between said first input and said current mirror means for acting as a $BV_{ceo}$ level shifter when the voltage at said first input exceeds the breakdown voltage of said at least one transistor;

output transistor means having a collector coupled to said first terminal, an emitter coupled to said second supply voltage conductor and having a base; and first means coupled between said comparator means and the base of said output transistor means for turning said output transistor means on so as to cause current to flow through said inductor when the voltage at said second terminal is below a predetermined value and for turning said output transistor means off when the current flowing through said output transistor means reaches a predetermined value.

7. A circuit according to claim 6 wherein said current mirror means comprises:

a first transistor having its base and collector coupled together for receiving said first current and having an emitter coupled to said second supply voltage conductor; and a second transistor having a base coupled to the base of said first transistor, an emitter coupled to said second supply voltage conductor, and a collector coupled to said at least one transistor such that said first and second currents are equal when the voltage at said first terminal is below the breakdown voltage of said at least one transistor, and said second current is greater than said first current when the voltage at said first terminal exceeds the breakdown voltage of said at least one transistor.

8. A circuit according to claim 7 further including means for limiting the collector-emitter voltage of said second transistor when the voltage at said first terminal is less than said breakdown voltage.

9. A circuit according to claim 8 wherein said at least one transistor has an emitter coupled to the collector of said second transistor, a collector coupled to said first terminal and to said comparator means and a base and wherein said means for limiting comprises:

first, second and third diode coupled transistors coupled between said first transistor and the base of said at least one transistor.

10. The circuit according to claim 9 wherein said comparator means comprises:

a fourth transistor having a base coupled to said first terminal, an emitter coupled to said first supply voltage conductor and a collector coupled to said first means; and a fifth transistor having an emitter coupled to the first supply voltage conductor, a base coupled to said reference voltage generating means, and a collector coupled to said second supply voltage conductor.

11. A circuit according to claim 10 further comprising level shifting means coupled between said first terminal and the base of said fourth transistor.

12. In a voltage boost circuit of the type wherein an output transistor is alternately turned on and off so as to first draw current through an inductor and then terminate the current through said output transistor so as to produce a voltage across the inductor which causes charge to be transferred to and stored in a capacitor, a circuit for sensing when the voltage cross the inductor falls below a predetermined value comprising:
   first and second supply voltage conductors;
   comparator means having first and second inputs;
   reference voltage generating means coupled to said first and second supply voltage conductors and to the second input of said comparator means for establishing a reference voltage at said second input;
   level shifting means coupled between the first terminal of said inductor and said first input;
   current mirror means coupled to said first input for receiving a first current and for generating a second current; and
   transistor means including at least one transistor coupled between said first input and said current mirror means for acting as a $BV_{ceo}$ level shifter when the voltage at said first input exceeds the breakdown voltage of said at least one transistor.

13. The circuit according to claim 12 wherein said comparator means comprises:
   a first transistor having a base coupled to said level shifter and to said at least one transistor, an emitter coupled to said first supply voltage conductor, and having a collector; and
   a second transistor having an emitter coupled to said first supply voltage conductor, a collector coupled to said second supply voltage conductor, and a base coupled to said reference voltage generating means, said first transistor being turned on when the voltage at said first input falls below said predetermined value.

* * * * *